United States Patent
Yang

(10) Patent No.: US 8,627,019 B2
(45) Date of Patent: Jan. 7, 2014

(54) METHOD AND DEVICE OF CONTROLLING MEMORY AREA OF MULTI-PORT MEMORY DEVICE IN MEMORY LINK ARCHITECTURE

(75) Inventor: Jung Woong Yang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 204 days.

(21) Appl. No.: 13/323,918

(22) Filed: Dec. 13, 2011

(65) Prior Publication Data
US 2012/0159049 A1    Jun. 21, 2012

(30) Foreign Application Priority Data
Dec. 16, 2010 (KR) .......................... 10-2010-0128792

(51) Int. Cl.
    *G06F 12/00*      (2006.01)
(52) U.S. Cl.
    USPC .......................................... 711/149; 711/103
(58) Field of Classification Search
    USPC ................................................. 711/149, 103
    See application file for complete search history.

(56) References Cited

U.S. PATENT DOCUMENTS

| | | | | |
|---|---|---|---|---|
| 7,606,982 | B2* | 10/2009 | Hwang et al. ................ | 711/147 |
| 2008/0320204 | A1* | 12/2008 | Jo et al. ....................... | 711/100 |
| 2010/0077130 | A1 | 3/2010 | Kwon | |
| 2011/0035575 | A1 | 2/2011 | Kwon | |
| 2011/0153959 | A1* | 6/2011 | Chu et al. .................... | 711/149 |

FOREIGN PATENT DOCUMENTS

| | | |
|---|---|---|
| KR | 1020100034415 A | 4/2010 |
| KR | 1020110013867 A | 2/2011 |

* cited by examiner

*Primary Examiner* — Hashem Farrokh
(74) *Attorney, Agent, or Firm* — Volentine & Whitt, PLLC

(57) ABSTRACT

A memory area managing method of a multi-port memory device in a memory link architecture which includes a multi-port memory device, a memory controller, and a flash memory, the method including performing a data processing step in which data stored in a host CPU area of the multi-port memory device is processed by a host CPU connected with the multi-port memory device, the processed data being stored in a shared area; performing a file data generating step in which file data on the processed data stored in the shared area is generated according to a write command of the host CPU, the file data being stored in a memory controller area of the multi-port memory device; and performing a file data storing step in which the file data is read out from the memory controller area and the read file data is sent to the flash memory.

13 Claims, 5 Drawing Sheets

METHOD AND DEVICE OF CONTROLLING MEMORY AREA OF MULTI-PORT MEMORY DEVICE IN MEMORY LINK ARCHITECTURE

CROSS-REFERENCE TO RELATED APPLICATIONS

A claim for priority under 35 U.S.C §119 is made to Korean Patent Application No. 10-2010-0128792 filed Dec. 16, 2010, the entirety of which is incorporated by reference herein.

BACKGROUND

The inventive concepts described herein relate to an embedded memory device, and more particularly, relate to a method and device capable of managing a memory area of a multi-port memory device in a memory link architecture.

An embedded memory device is a device which is connected with a host such as a handheld phone, a digital camera, an MP3 player, etc., and which stores data (e.g., moving pictures, pictures, etc.) transferred from the host.

Examples of embedded memory devices include an embedded multimedia card (EMMC), a security digital (SD) card, a memory link architecture (MLA), etc., which are formed as including a flash memory and a controller for controlling data exchange between the flash memory and a host.

FIG. 1 is a block diagram illustrating a typical embedded memory device. Referring to FIG. 1, an EMMC is shown as an example of embedded memory device 100. The embedded memory device 100 includes a flash memory 110 and a controller 120.

In the embedded memory device 100, the controller 120 maps file data transferred from host 10 using a flash translation layer (FTL), and stores the data in the flash memory 110.

The host 10 connected with the embedded memory device 100 includes a CPU 11 and a memory 12. The host 10 processes data stored in the memory 12 using an application included in the CPU 11, and converts the processed data into a file format using a file system. The host 10 maps the converted file and transfers it to the embedded memory device 100 using an EMMC driver included in the CPU 11.

Both an application and a file system are driven by the CPU 11 included in the host 10 to which the embedded memory device 100 is connected. This means that the efficiency of CPU resources is lowered when the CPU 11 controls an internal operation of the host 10 and other operations thereof.

In particular, performance (e.g., speed) of the CPU 11, which is used in a multimedia device to which more complicated and various functions are added as technology advances, is lowered. Further, power consumption of the host 10 increases since a file system is driven by the CPU 11.

In addition, in the embedded memory device, a sudden power off recovery (SPOR) phenomenon arises due to an asynchronous characteristic between file data generated by the CPU 11 of the host 10 and file data converted by the FTL stored in the embedded memory device.

SUMMARY

A memory area managing method of a multi-port memory device in a memory link architecture and a device using the same are provided to make better use of resources of a CPU of a host connected with an embedded memory device.

The memory area managing method of a multi-port memory device in the memory link architecture and the device using the same are further provided to reduce power consumption of a host connected with an embedded memory device and to prevent a sudden power off recovery (SPOR) phenomenon.

In an embodiment of the inventive concept, a memory area managing method of a multi-port memory device in a memory link architecture which includes a multi-port memory device, a memory controller, and a flash memory, includes performing a data processing step in which data stored in a host CPU area of the multi-port memory device is processed by a host CPU connected with the multi-port memory device, the processed data being stored in a shared area of the multi-port memory device; performing a file data generating step in which file data is generated from the processed data stored in the shared area according to a write command of the host CPU, the file data being stored in a memory controller area of the multi-port memory device; and performing a file data storing step in which the file data is read out from the memory controller area and the read file data is sent to the flash memory.

In another embodiment of the inventive concept, a device for managing a memory area of a multi-port memory device in a memory link architecture comprises a flash memory; a multi-port memory device including a plurality of memory areas configured to store data transferred from a host, data processed by a host CPU, and file data; and a memory controller configured to generate file data from processed data stored in the multi-port memory device according to a write command of the host CPU, the file data being stored in the flash memory.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
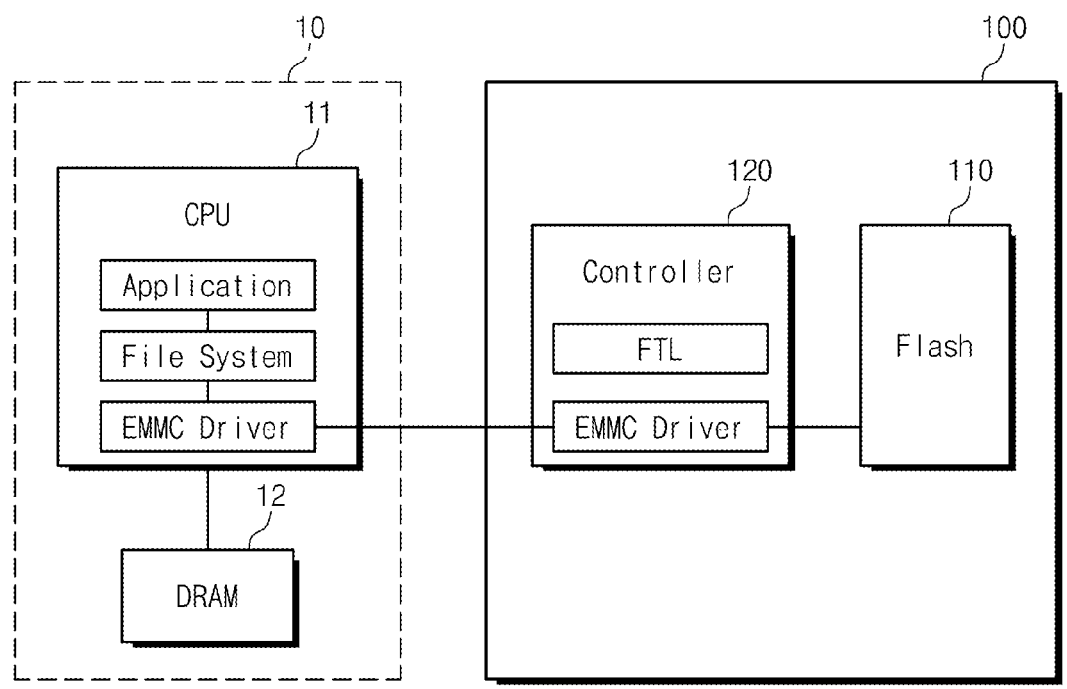
FIG. 1 is a block diagram illustrating a typical embedded memory device.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
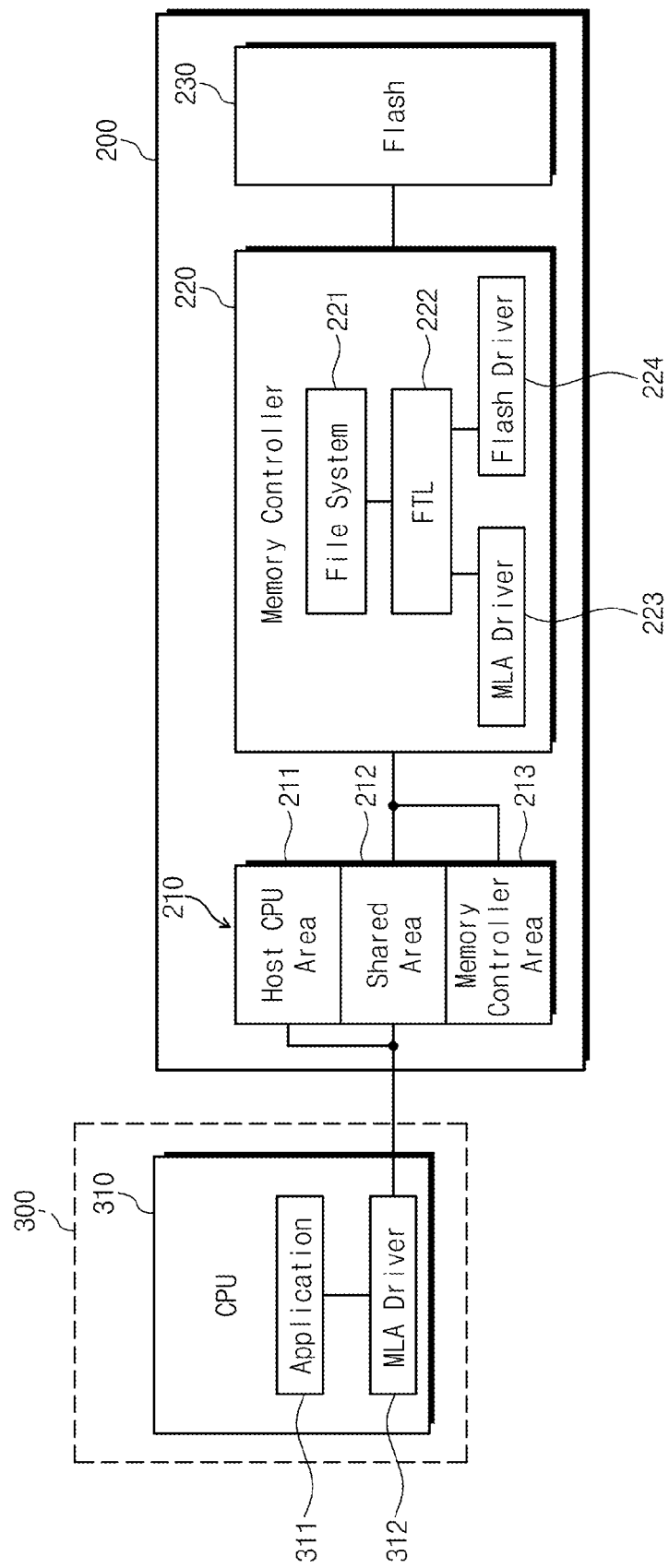
FIG. 2 is a block diagram illustrating a memory link architecture according to an exemplary embodiment of the inventive concept.
Figure 3:
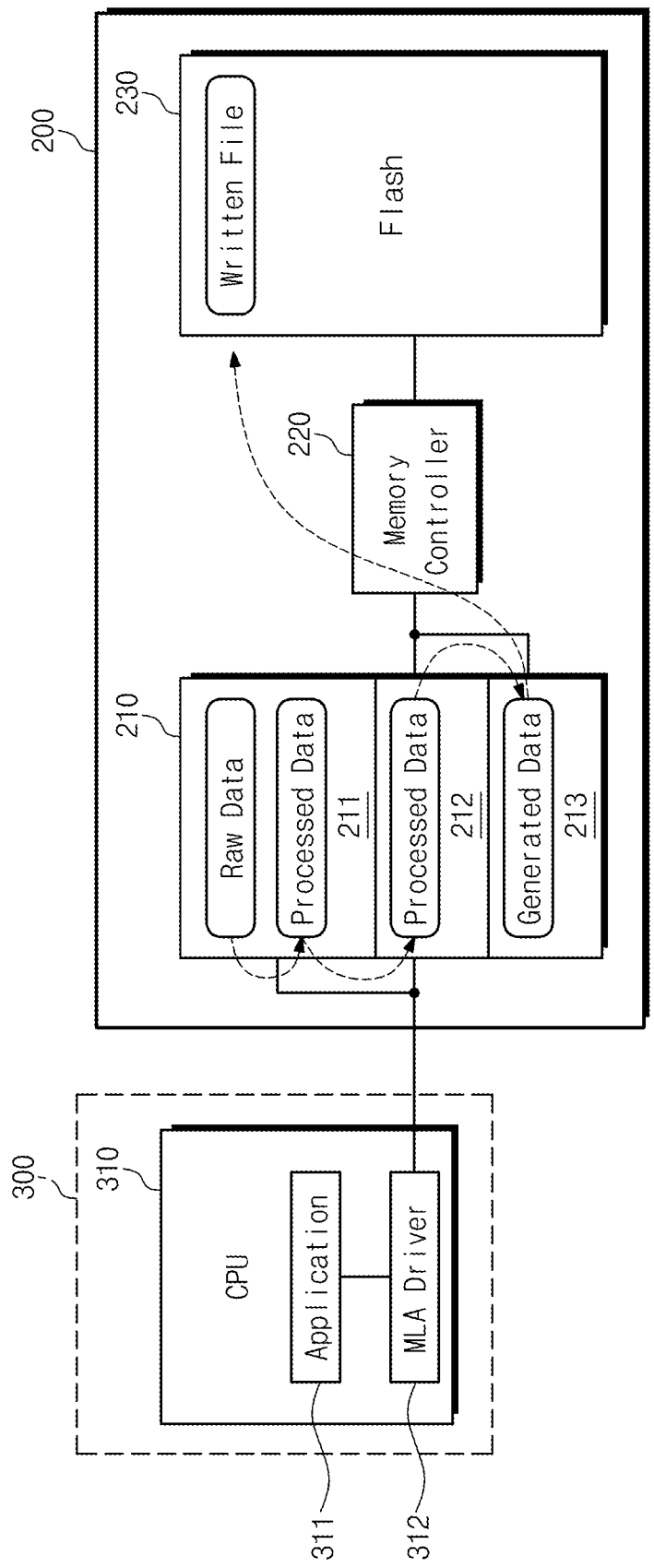
FIG. 3 is a diagram for describing an operation of a memory link architecture in FIG. 2.

FIG. 2 is a block diagram illustrating a memory link architecture according to an exemplary embodiment of the inventive concept, and FIG. 3 is a diagram for describing an operation of a memory link architecture in FIG. 2. Referring to FIG. 2, a memory link architecture (MLA) 200 includes a multi-port memory 210, a memory controller 220, and a flash memory 230. The MLA 200 is connected with a host 300 and stores data transferred from the host 300. The MLA 200 is an embedded storage/memory device.

The host 300 includes a CPU 310. CPU 310 includes an application 311 and an MLA driver 312. The host 300 may be a multimedia device such as a digital camera, a handheld phone, a PMP, or an MP3P.

The multi-port memory device 210 includes a host CPU area 211, a shared area 212, and a memory controller area 213. The multi-port memory device 210 may be a oneDRAM. The multi-port memory device 210 stores data transferred from the host 300 in the host CPU area 211.

If data (raw data) is stored in the host CPU area 211, the host CPU 310 reads data via an access to the host CPU area 211 of the multi-port memory device 210, processes the read data via execution of the application 311, and stores the processed data in the host CPU area 211, as shown in FIG. 3.

If execution of the application 311 is completed, the MLA driver 312 in the CPU 310 of the host 300 transfers the processed data stored in the host CPU area 211 into the shared area 212, as also shown in FIG. 3.

If transferring of the processed data is completed, the controller 220 of the MLA 200 generates file data by executing a file system on the processed data stored in the shared area 212 according to a write command of the host CPU 310, and stores the file data in the memory controller area 213 as the generated data as also shown in FIG. 3.

That is, the file system 221 in the memory controller 220 reads the processed data stored in the shared area 212 according to a write command of the host CPU 310 and generates file data on the processed data. The controller 220 may be formed of an application specific IC (ASIC).

The MLA driver 223 in the memory controller 220 also receives file data generated by the file system 221, and stores it in the memory controller area 213 of the multi-port memory device 210.

If storing of the file data in the multi-port memory device 210 is ended, the controller 220 reads the stored file data, maps the read file data for storage in the flash memory 230 using a flash translation layer (FTL) 222, and sends it to the flash memory 230. That is, the file data may be stored in the flash memory 230. The storing operation of the file data may be performed by the flash driver 224.

The flash memory 230 may be formed of a NAND flash memory.

Figure 4:
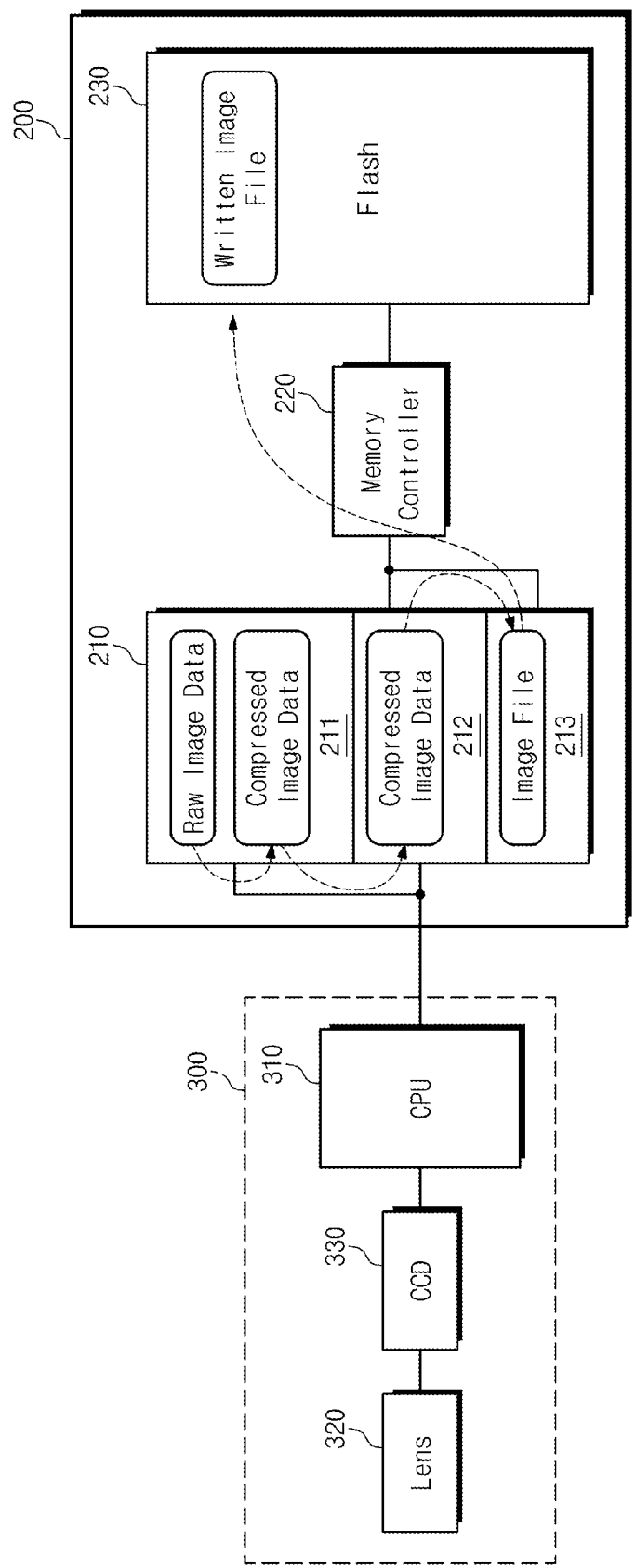
FIG. 4 is a block diagram illustrating another example of an MLA according to an exemplary embodiment of the inventive concept.

FIG. 4 is a block diagram illustrating another example of an MLA according to an exemplary embodiment of the inventive concept. In FIG. 4, there is exemplarily illustrated the case that the MLA 200 is connected with host 300, which may be an image pick-up device (e.g., a digital camera), to compress images and store the compressed images.

Referring to FIGS. 2 and 4, an image received via a lens 320, which is an input device of host (image pick-up device) 300, is converted into imaged data via a charge-coupled device (CCD) 330.

Host CPU 310 in the host 300 may be configured to include application 311 and MLA driver 312 as shown in FIG. 2. Host 310 sends the input image data to a host CPU area 211 of a multi-port memory device 210 in the MLA 200. At this time, the image data is raw data which is not yet compressed.

If the image data is stored in the host CPU area 211 of the multi-port memory device 210, the host CPU 310 compresses data via execution of a compression application (or, driving of an application 311) on the image data and stores the compressed image data in the host CPU area 211.

In the event that data compression of the host CPU 310 is ended, the MLA driver 312 of the host CPU 310 reads the compressed image data stored in the host CPU area 211 of the multi-port memory device 210 and transfers it to a shared area 212 of the multi-port memory device 210.

Once the compressed image data is sent to the shared area 212, the memory controller 220 of the MLA 200 which may include file system 221, FTL 222, MLA driver 223 and flash driver 224 as shown in FIG. 2, reads the compressed image data stored in the shared area 212, generates file data on the compressed image data via driving of a file system 221, and stores the file data (image file) in a memory controller area 213 of the multi-port memory device 210 via the MLA driver 223 in the memory controller 220.

If the file data is generated, the memory controller 220 reads the file data stored in the memory controller area 213 of the multi-port memory device 210 and maps it using the flash translation layer 222 so as to be stored in the flash memory 230.

A flash memory driver 224 in the memory controller 220 transfers the file data mapped by the flash translation layer 222 to the flash memory 230, so that the compressed image data is stored in the flash memory 230.

Figure 5:
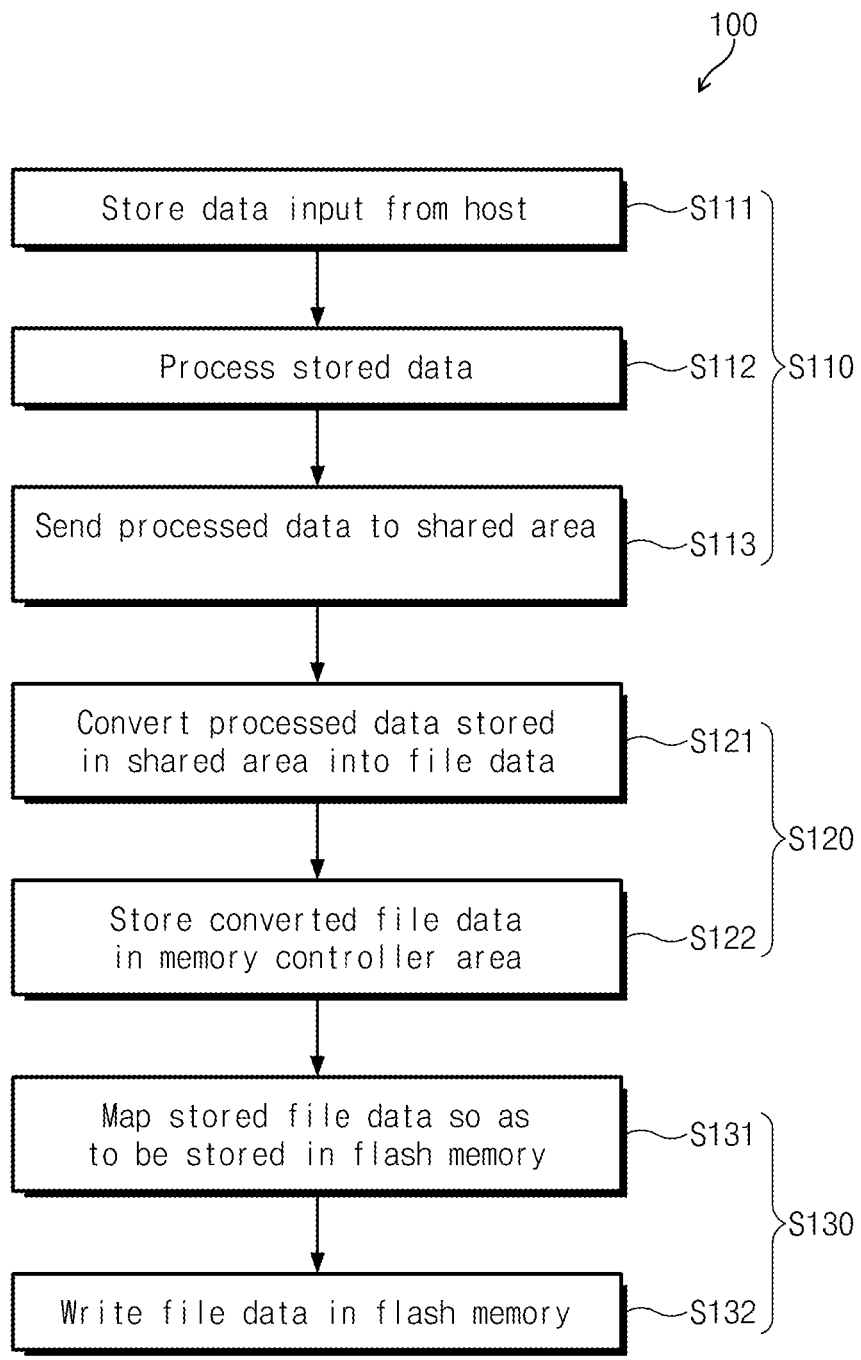
FIG. 5 is a flowchart for describing a method of managing a memory area of a multi-port memory device in a memory link architecture according to an exemplary embodiment of the inventive concept.

FIG. 5 is a flowchart for describing a method of managing a memory area of a multi-port memory device in a memory link architecture according to an exemplary embodiment of the inventive concept. Referring to FIGS. 2 and 5, a memory area managing method 100 of a multi-port memory device 210 in a memory link architecture includes a data processing step S110, a file data generating step S120, and a file storing step S130.

In the data processing step S110, data stored in a host CPU area 211 of a multi-port memory device 210 is processed by a host CPU 310 connected with the multi-port memory device 210, and the processed data is stored in a shared area 212.

In particular, the data processing step S110 includes storing data transferred from a host 300 in the host CPU area 211 of the multi-port memory device 210 (S111), processing data stored in the host CPU area 211 by executing an application (S112), and sending the processed data obtained from the data stored in the host CPU area 211 to a shared area 212 (S113). Herein, the processing and the sending may be made by the host CPU 310.

In the file data generating step S120, file data on the processed data stored in the shared area 212 of a multi-port memory device 210 is generated according to a write command of the host CPU 310, and the file data is stored in a memory controller area 213 of the multi-port memory device 210.

In particular, the file data generating step S120 includes generating file data by executing a file system on the processed data stored in the shared area 212 (S121) and sending the generated file data to the memory controller area 213 of the multi-port memory device 210 (S122).

In the file data storing step S130, the file data stored in the memory controller area 213 of the multi-port memory device 210 is stored in a flash memory 230.

The file data storing step S130 includes mapping the file data read from the memory controller area 213 of the multi-port memory device 210 using a flash translation layer (FTL) (S131) and sending the mapped file data to the flash memory 230 (S132). That is, the mapped file data is stored in the flash memory 230.

As described above, the host CPU 310 only drives an application for processing data stored in the multi-port memory device 210, and the file system 221 for generating file data is driven within the MLA 200 connected with the host 300 to store the file data. Accordingly, it is possible to make better use of the host CPU 310 and to reduce power consumption.

Further, it is possible to prevent a sudden power off recovery (SPOR) phenomenon by reducing an asynchronous characteristic between file data generated by the file system 221 and file data converted by the flash translation layer (FTL).

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A memory area managing method of a multi-port memory device in a memory link architecture which includes a multi-port memory device, a memory controller, and a flash memory, the memory area managing method comprising:
performing a data processing step in which data stored in a host CPU area of the multi-port memory device is processed by a host CPU connected with the multi-port memory device, the processed data being stored in a shared area of the multi-port memory device;
performing a file data generating step in which file data is generated from the processed data stored in the shared area according to a write command of the host CPU, the file data being stored in a memory controller area of the multi-port memory device; and
performing a file data storing step in which the file data is read out from the memory controller area and the read file data is sent to the flash memory.

2. The memory area managing method of claim 1, wherein the data processing step comprises:
storing data transferred from the host CPU in the host CPU area of the multi-port memory device;
executing an application to process data stored in the host CPU area, the application being executed by the host CPU; and
sending the processed data stored in the host CPU area to the shared area under a control of the host CPU.

3. The memory area managing method of claim 1, wherein the file data generating step comprises:
generating file data by executing a file system on the processed data stored in the shared area; and
sending the generated file data to the memory controller area.

4. The memory area managing method of claim 1, wherein the file data storing step comprises:
reading file data stored in the memory controller area to map the read file data using a flash translation layer; and
sending the file data mapped by the flash translation layer to the flash memory.

5. The memory area managing method of claim 1, wherein the processed data comprises compressed image data.

6. A device for managing a memory area of a multi-port memory device in a memory link architecture, the device comprising:
a flash memory;
a multi-port memory device including a plurality of memory areas configured to store data transferred from a host, data processed by a host CPU, and file data; and
a memory controller configured to generate file data from processed data stored in the multi-port memory device according to a write command of the host CPU, and to store the file data into the flash memory.

7. The device of claim 6, wherein the plurality of memory areas comprises:
   a host CPU area configured to store data transferred from the host and data processed by the host CPU;
   a shared area configured to store the processed data, the processed data in the shared area being read by the memory controller; and
   a memory controller area configured to store file data of the processed data, the file data being generated by the memory controller.

8. The device of claim 6, wherein the memory controller comprises:
   a file system configured to generate file data from the processed data;
   a memory link architecture driver configured to transfer the processed data to the file system or to transfer the file data generated by the file system to a memory controller area of the multi-port memory device;
   a flash translation layer configured to map the file data for storage in the flash memory; and
   a flash driver configured to send the mapped file data to the flash memory.

9. The device of claim 6, wherein the processed data comprises compressed image data.

10. The device of claim 6, wherein the memory controller is an application specific integrated circuit.

11. The device of claim 6, wherein the memory link architecture is an embedded storage/memory device.

12. A device for managing a memory area of a multi-port memory device in a memory link architecture, the device comprising:
   a flash memory;
   a multi-port memory device including a plurality of memory areas; and
   a memory controller configured to generate file data from data stored in the multi-port memory device responsive to a write command from a host and to store the file data in the flash memory,
   wherein the plurality of memory areas include a host area configured to store raw image data transferred by the host and compressed image data processed by the host, a shared area configured to store the compressed image data under control of the memory controller, and a memory controller area configured to store the file data generated by the memory controller, and
   wherein the memory controller generates the file data from the compressed image data.

13. The device of claim 12, wherein the memory controller comprises:
   a file system configured to generate file data from the compressed image data;
   a memory link architecture driver configured to transfer the compressed image data to the file system or to transfer the file data generated by the file system to the memory controller area of the multi-port memory device;
   a flash translation layer configured to map the file data for storage in the flash memory; and
   a flash driver configured to send the mapped file data to the flash memory.

\* \* \* \* \*